(12) United States Patent
Zhang et al.

(10) Patent No.: US 12,271,033 B2
(45) Date of Patent: Apr. 8, 2025

(54) HETEROGENEOUS GaN LASERS AND ACTIVE COMPONENTS

(71) Applicant: Nexus Photonics, Inc., Goleta, CA (US)

(72) Inventors: Chong Zhang, Santa Barbara, CA (US); Minh Tran, Goleta, CA (US); Tin Komljenovic, Goleta, CA (US)

(73) Assignee: Nexus Photonics Inc., Goleta, CA (US)

( * ) Notice: Subject to any disclaimer, the term of this patent is extended or adjusted under 35 U.S.C. 154(b) by 578 days.

(21) Appl. No.: 17/738,608

(22) Filed: May 6, 2022

(65) Prior Publication Data

US 2023/0361534 A1 Nov. 9, 2023

(51) Int. Cl.
*G02B 6/14* (2006.01)
*G02B 6/122* (2006.01)

(52) U.S. Cl.
CPC ............. *G02B 6/14* (2013.01); *G02B 6/1228* (2013.01)

(58) Field of Classification Search
CPC ................................ G02B 6/14; G02B 6/1228
See application file for complete search history.

(56) References Cited

U.S. PATENT DOCUMENTS 10,859,764 B2 12/2020 Park
2011/0205660 A1* 8/2011 Komura ............... G02B 6/1228
360/59
2012/0328243 A1* 12/2012 Fang ....................... G02B 6/305
385/50
2015/0277054 A1* 10/2015 Park ...................... G02B 6/1228
385/14
2017/0179681 A1* 6/2017 Barwicz ............... H10D 84/038

OTHER PUBLICATIONS

N. Iizuka et al. Integration of GaN/AlN all-optical switch with SiN/AlN waveguide utilizing spot-size conversion. Optics Express, 17: 25, 23247-23253, Dec. 7, 2009 (https://doi.org/10.1364/OE.17.023247) (Year: 2009).*
M.T. Hardy et al. Indium-tin-oxide clad blue and true green semipolar InGaN/GaN laser diodes. Applied Physics Letters, 103, 081103, Aug. 20, 2013 (https://doi.org/10.1063/1.4819171) (Year: 2013).*

(Continued)

*Primary Examiner* — Michael Stahl
(74) *Attorney, Agent, or Firm* — LEEPI

(57) ABSTRACT

A device comprises first, second, third and fourth elements fabricated on a common substrate. The first element comprises an active waveguide structure supporting a first optical mode, the second element comprises a passive waveguide structure supporting a second optical mode, the third element, at least partly butt-coupled to the first element, comprises an intermediate waveguide structure supporting intermediate optical modes, and a fourth element comprising TCO material that is attached to the first element. If the first optical mode differs from the second optical mode by more than a predetermined amount, a tapered waveguide structure in at least one of the second and third elements facilitates efficient adiabatic transformation. No adiabatic transformation occurs between any of the intermediate optical modes and the first optical mode. Mutual alignments of the first, the second, the third, and the fourth elements are defined using lithographic alignment marks.

20 Claims, 7 Drawing Sheets

(56) References Cited

OTHER PUBLICATIONS

A. Myzaferi et al. Zinc oxide clad limited area epitaxy semipolar III-nitride laser diodes. Optics Express, 26:10, 12490-12498, May 14, 2018 (https://doi.org/10.1364/OE.26.012490) (Year: 2018).*
Extended European search report for application EP 22184737.9, dated Jan. 5, 2023. (Year: 2023).*

* cited by examiner

HETEROGENEOUS GaN LASERS AND ACTIVE COMPONENTS

FIELD OF THE INVENTION

The present invention relates to semiconductor lasers, amplifiers, modulators, and photodetectors. More specifically, certain embodiments of the invention relate to improved performance of heterogeneously integrated lasers, amplifiers, modulators and photodetectors using dissimilar materials that are optically coupled. The development of the present invention was supported in part by the US government funding, DARPA contract #HR001120C0135.

BACKGROUND OF THE INVENTION

A photonic integrated circuit (PIC) or integrated optical circuit is a device that integrates multiple photonic functions and as such is analogous to an electronic integrated circuit. The major difference between the two is that a photonic integrated circuit provides functions for information signals imposed on optical carrier waves. The material platform most commercially utilized for photonic integrated circuits is indium phosphide (InP), which allows for the integration of various optically active and passive functions on the same chip. Although many current PICs are realized in InP platforms, there has been significant research in the past decade in using silicon rather than InP for the realization of PICS, due to some superior characteristics as well as superior processing capabilities for the former material, that leverage the investment already made for electronic integrated circuits.

The biggest drawback in using silicon for PICs is that it is an indirect bandgap material which makes it hard to provide electrically pumped optical sources. This problem is generally solved by assembling PICs comprising two or more chips made from dissimilar materials in separate processes. Such an approach is challenging due to a need for very fine alignment, which increases packaging costs and introduces scaling limitations. Another approach to solving the bandgap problem is to bond two dissimilar materials and process them together, removing the need for precise alignment during the bonding of larger pieces or complete wafers of the dissimilar materials, and allowing for mass fabrication. In this disclosure, we use the term "hybrid" to describe the first approach that includes precise assembly of separately processed parts, and we use the term "heterogeneous" to describe the latter approach of bonding two materials and then processing the bonded structure to define the waveguides and other components of interest.

To transfer the optical signal between dissimilar materials, the heterogeneous approach generally utilizes tapers whose dimensions are gradually reduced until the effective mode refractive indices of dissimilar materials match and there is efficient power transfer. This approach generally works well when materials have similar refractive indices as is the case with silicon and InP. In cases where there is larger difference in effective indices, such as between e.g. SiN and GaN, the requirements on taper tip dimensions become more challenging and potentially limiting efficient power transfer. Specifically, small taper tip widths in GaN may be necessary to provide good coupling. Achieving such dimensions is complex and may be not cost-effective. Furthermore, electrical pumping of such narrow tapers is challenging, and if, insufficiently pumped, could result with increased coupling losses.

Although InP and silicon-based PICs address many current needs, they have some limitations; among them are the fact that the operating wavelength range is limited by material absorption increasing the losses, and the fact that there is a limit on the maximum optical intensities and consequently optical powers that a PIC can handle. To address these limitations, alternate waveguide materials have been considered, such as SiN, $TiO_2$, $Ta_2O_5$, AlN or others. Many current and emerging applications can leverage PICs operating at or around visible wavelengths (300 nm to 600 nm), a wavelength range that is generally addressed by GaN material system to provide efficient light generation.

In general, above mentioned dielectric waveguides have higher bandgap energies which provides better high-power handling and transparency at shorter wavelength, but, in general such materials also have lower refractive indices. E.g. SiN with bandgap of ~5 eV has refractive index of ~2, AlN has bandgap of ~6 eV and refractive index of around ~2, and $SiO_2$ with bandgap of ~8.9 eV has refractive index of ~1.44. For comparison, the refractive index of GaN>2.4. This makes the tapered approach challenging.

The alternative hybrid approach suffers from the drawbacks already mentioned above, namely the need for precise alignment, and correspondingly complex packaging and scaling limitations.

A recent approach to the problems discussed above was presented in U.S. Pat. No. 10,859,764 B2 employing butt-coupling in combination with a mode-converter to allow the heterogenous process to be used without the need for extremely small taper widths, even if the refractive index difference is large. The approach presented in U.S. Pat. No. 10,859,764 B2 is suitable for InP and GaAs integration, which generally have more flexibility in growth including higher-quality p-side contacts. GaN material, use to emit in and around visible wavelengths, is more challenging to grow, especially the p-side contact and growth, generally, results with increased growth defects requiring modified heterogeneous integration.

The present invention is directed towards PICs employing GaN actives integrated with high-performance waveguides that includes lasers, amplifiers, modulators and photodetectors with improved performance. In particular, embodiments described below are concerned with the detailed design of the heterogeneous integration, optical coupling structure and mode control necessary for creating of high-performance lasers, amplifiers, modulators and photodetectors.

DETAILED DESCRIPTION

Described herein include embodiments of a platform for realization of photonic integrated circuits using wafer bonding and deposition of dissimilar materials where optical coupling is improved by use of mode conversion and a butt-coupling scheme, and performance is optimized for robust, fabrication tolerant coupling and mode-control in the active region.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Figure 2A:
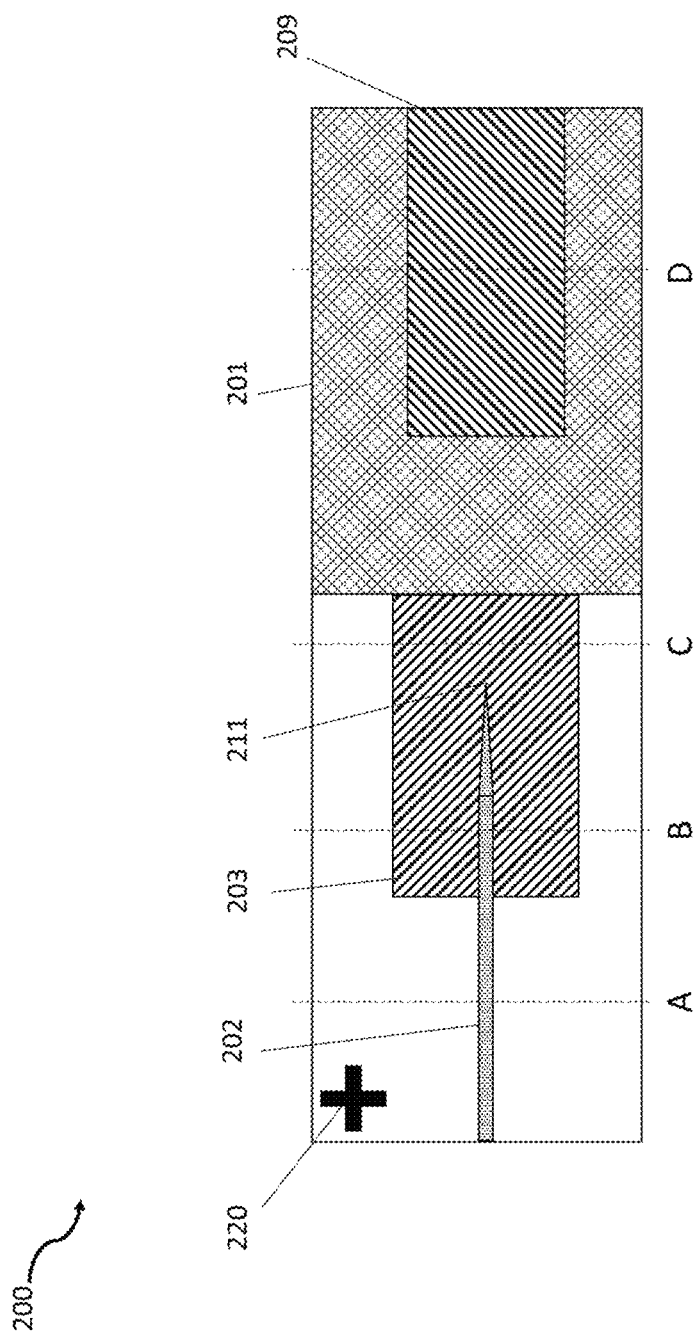
FIG. 2 (a), FIG. 2 (b), and FIG. 2 (c) show three cross-sectional top-down views of devices according to some embodiments of the present invention.
Figure 2B:
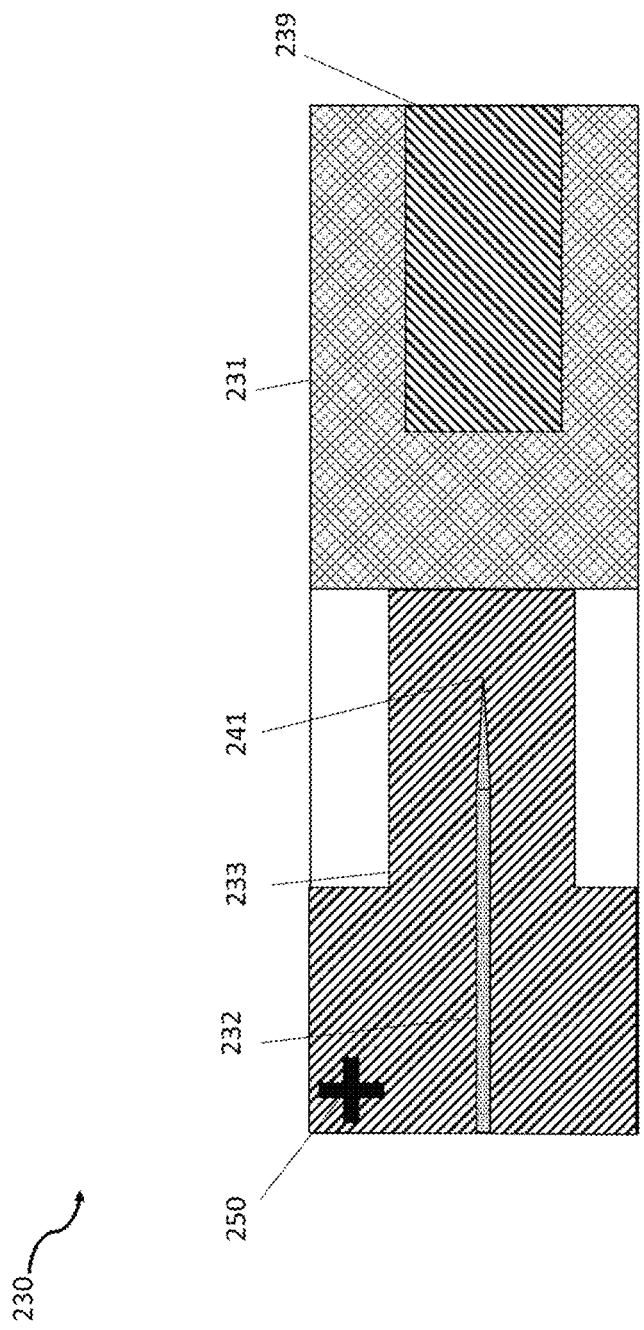
Figure 2C:
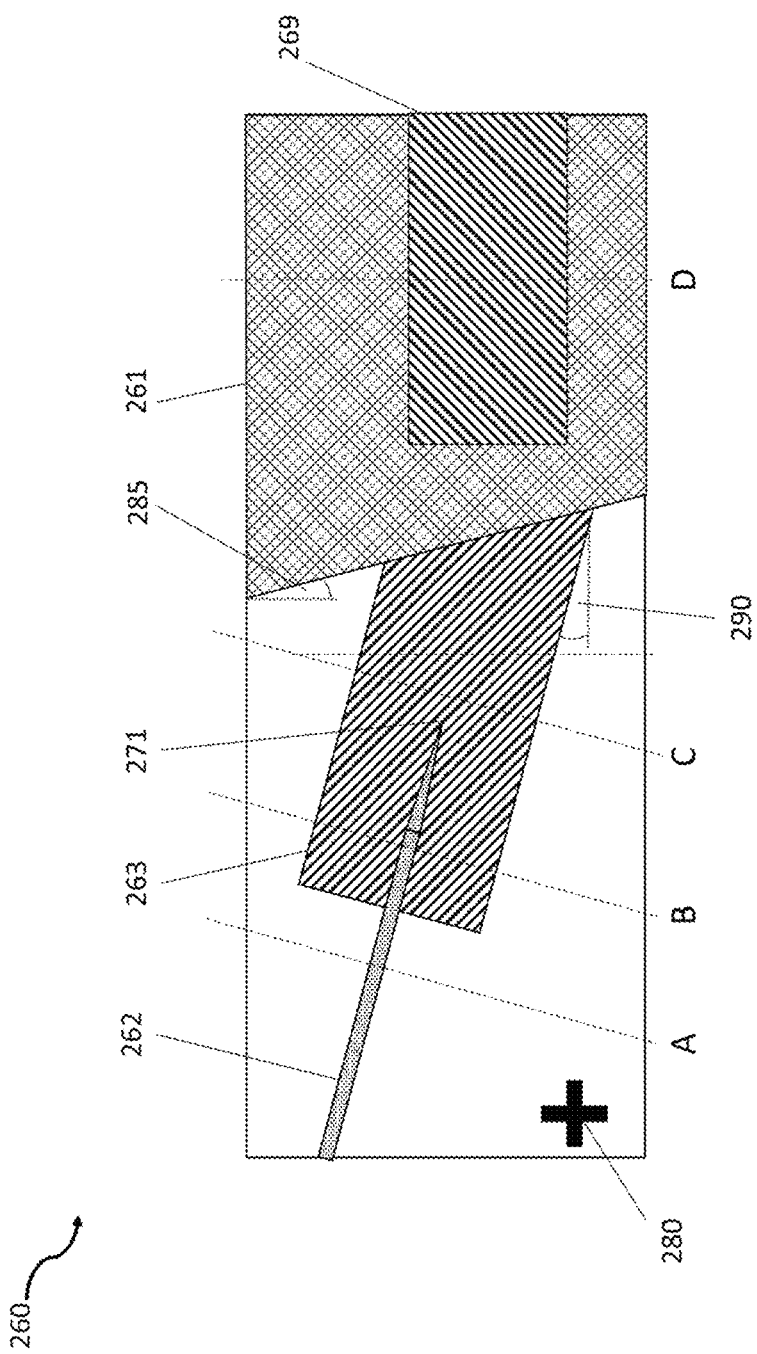

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" means that two or more elements are in direct contact in at least part of their surfaces. The term "butt-coupled" is used herein in its normal sense of meaning an "end-on" or axial coupling, where there is minimal or zero axial offset between the elements in question. The axial offset may be, for example, slightly greater than zero in cases where a thin intervening layer of some sort is formed between the elements, such as e.g. thin coating layer typically used to provide high-reflectivity or anti-reflectivity functionality. It should be noted that the axes of two waveguide structures or elements need not be colinear for them to be accurately described as being butt-coupled. In other words, the interface between the elements need not be perpendicular to either axis. FIG. 2 (a), FIG. 2 (b), and FIG. 2 (c) embodiments discussed below are exemplary of such possibilities.

Term "active device" may be used herein. A device or a part of a device called active is capable of light generation, amplification, modulation and/or detection. This is in contrast to what we mean by a "passive device" whose principal function is to confine and guide light, and/or provide splitting, combining, filtering and/or other functionalities that are commonly associated with passive devices. Some passive devices can provide functions overlapping with active device functionality, such as e.g. phase tuning implemented using thermal effects or similar that can provide modulation. No absolute distinction should be assumed between "active" and "passive" based purely on material composition or device structure. A silicon device, for example, may be considered active under certain conditions of modulation, or detection of low wavelength radiation, but passive in most other situations.

Figure 1:
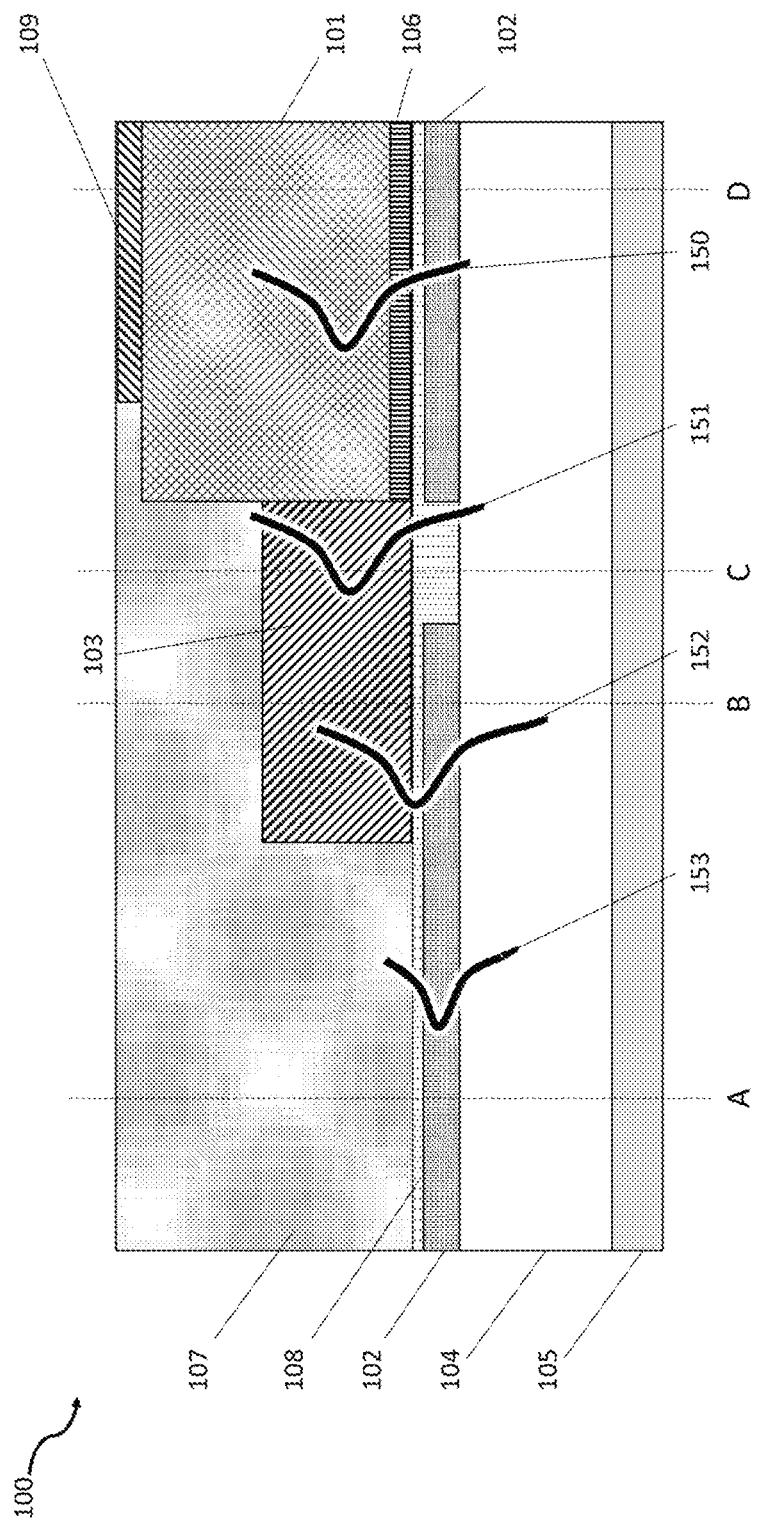
FIG. 1 illustrates a device according to one embodiment of the present invention, shown in cross section.

FIG. 1 is a schematic cross-section view of an integrated photonic device 100 utilizing butt-coupling and mode conversion for efficient coupling between dissimilar materials. Dashed lines A, B, C and D correspond to cross-sectional end-on views of a device according to some embodiments of the present invention described in more detail with the help of FIG. 3 (a), and FIG. 3 (b) and more specifically end-on-views 300A, 300B, 300C and 300D.

The exemplary cross-section includes a substrate 105 that can be any suitable substrate for semiconductor and dielectric processing, such as Si, quartz, sapphire, glass, or other materials known in the art. In the shown embodiment, a layer of second material 104 is deposited, grown, transferred, bonded or otherwise attached to the top surface of substrate 105 using techniques known in the field. The main purpose of layer 104 is to provide optical cladding for material 102 (to be described below), if necessary to form an optical waveguide. Optical waveguides are commonly realized by placing higher refractive index core between two lower refractive index layers to confine the optical wave. In some embodiments, layer 104 is $SiO_2$. In some embodiments, layer 104 is omitted and substrate 105 itself serves as a cladding.

Layer 102 is deposited, grown, transferred, bonded or otherwise attached to the top of layer 104 if present, and/or to the top of substrate 105, using techniques known in the field. The refractive index of layer 102 is higher than the refractive index of layer 104 if present, or, if layer 104 is not present, the refractive index of layer 102 is higher than the refractive index of substrate 105. In one embodiment, the material of layer 102 may include, but is not limited to, one or more of SIN, $TiO_2$, $Ta_2O_5$, $SiO_2$, $LiNbO_3$ and AlN. In some embodiments, e.g. when layer 102 is $SiO_2$, it can be doped with other materials to control the refractive index. Either or both of layers 104 and 102 can be patterned, etched, or redeposited as is common in the art.

Layer 108, whose refractive index is lower than the refractive index of layer 102, overlays layer 102 and underlays layers 106 and 103 (to be described in more detail below) and serves to planarize the patterned surface of layer 102. In some embodiments, the planarity of the top surface of layer 108 is provided by chemical mechanical polishing (CMP) or other etching, chemical and/or mechanical polishing methods. In other embodiments, the planarity is provided because of the intrinsic nature of the method by which layer 108 is deposited, for example if the material of layer 108 is a spin-on glass, polymer, photoresist or other suitable material. The planarization may be controlled to leave a layer of desired, typically very low, thickness on top of the layer 102 (as shown in FIG. 1), or to remove all material above the level of the top surface of the layer 102 (not shown). In the case layer 108 is left on top of layer 102, the target thicknesses are in the range of several nm to several hundreds of nm, with practical thickness including the typical across wafer non-uniformity of the planarization process. In some embodiments, spin-on material is used to planarize and is then etched back resulting with improved across wafer uniformity compared to typical CMP processes. In some embodiments, layer 108 is not deposited and top surface is not planarized as will be described with the help of FIG. 4.

Layer 101 is bonded on top of the whole or part of the corresponding (108, 102) top surface using layer 106 as interlayer providing at least one of electrical contact, current spreading, optical mode confinement and/or improvement of surface quality used to bond to corresponding (108, 102) top surface as will be explained with the help of FIG. 3 (*a*), and FIG. 3 (*b*). In one embodiment, layer 106 comprises Transparent Conductive Oxide (TCO). TCOs are metal oxide materials which exhibit high optical transmission at visible wavelengths and high conductivity close to that of metals. Some examples of commonly used TCOs include Indium-Tin-Oxide (ITO), Zinc Oxide (ZnO), Aluminum-doped Zinc Oxide (AZO). Bottom surface of layer 101, in some embodiments, is planarized prior to deposition of layer 106 and bonding to corresponding (108, 102) top surface. In other embodiments, the deposition of layer 106 serves to improve the surface quality prior to bonding. In some embodiments, both the bottom surface of layer 101 is planarized prior to bonding and layer 106 further improves the surface quality.

Said bonding can be direct molecular bonding or can use additional materials to facilitate bonding such as e.g. polymer films as is known in the art. Layer 101 makes up what is commonly called an active region, and may be made up of materials including, but not limited to, GaN and GaN based ternary and quaternary materials as will be described in more detail with the help of FIG. 3 (*a*), and FIG. 3 (*b*). Layer 101 in one embodiment is multilayered, comprising layers providing optical confinement, electrical confinement and/or electrical contacts, as is known in the art for active devices. In yet another embodiment, layer 101 uses lower layers 106, 108, 102, 104 and/or 105 to provide optical confinement and/or one or more electrical contacts.

In some embodiments, layer 101 can be efficiently electrically pumped to generate optical emission and gain. The present invention enables efficient optical coupling between waveguides formed in layer 101 and layer 102 and facilitates improved manufacturability and performance by using layer 106 as interlayer between 101 and corresponding (108/102) top surface. Said materials of layer 102 can provide additional functionality such as wide-band transparency, high intensity handling, phase shifting by temperature, strain or other tuning mechanisms, combining, splitting, filtering and/or others as is known in the art.

Efficient coupling is facilitated by layer 103 which serves as an intermediate waveguide that in some embodiments accepts the profile (depicted by dashed line 150) of an optical mode supported by the waveguide for which layer 101 provides the core, captures it efficiently as mode profile 151, and gradually transfers it to mode profiles 152 and finally 153. Mode profile 153 is efficiency supported by the waveguide for which layer 102 provides the core. In other embodiments, the direction of travel may be reversed, with layer 103 efficiently capturing an optical mode supported by the waveguide for which layer 102 provides the core and gradually transforming its mode profile to that of a mode supported by the waveguide for which layer 101 provides the core.

The refractive index of layer 103 can be engineered to facilitate efficient coupling of mode profile 150 and to efficiently transform the mode to one with mode profile 153 by taking advantage of tapered structures made in at least one of layers 102 and 103. Prior to the present invention i.e. in the absence of intermediate layer 103, the requirements on taper tip width would be, as discussed above, problematic. The use of intermediate layer 103, however, significantly reduces the stringent requirements on taper tip width, allowing efficient transfer between higher refractive index materials (such as e.g. GaN and its ternaries and quaternaries in layer 101) to lower refractive index materials (such as e.g. SiN, SiNOx, doped SiO$_2$, etc. in layer 102).

Differences between the optical modes supported by waveguides in layers 101 and 102 respectively may or may not be obvious by observation of the mode profiles, but mode overlaps less than 100% and vertical offset between modes 150 and 153 could (in the absence of intermediate layer 103) result in significant optical loss. In some cases, it may be considered that losses of up to 1 dB are acceptable, but losses greater than that are not. In other cases, a 3 dB loss level may be the criterion chosen. The function of layer 103 is to keep optical loss due to imperfect mode overlap below whatever is determined to be an acceptable level in a given application.

The upper cladding layer 107 for waveguides realized in 103 and/or 102 can be ambient air (meaning no cladding material is actually deposited) or can be any other deliberately deposited suitable material as shown in FIG. 1, including, but not limited to, a polymer, SiO2, SiNx, SiNOx etc. In some embodiments same material is used for layer 107 and layer 108. In some embodiments (not shown in FIG. 1), layer 107 cladding functionality can be provided with multiple depositions, e.g. one material provides the cladding for mode 153 guided by core formed in layer 102, and another material provides the cladding for mode 151 guide by core formed in layer 103. In yet other embodiments, additional materials in layer 107 serve to passivate surfaces of e.g. layer 101 as is known in the art. In all cases, the refractive index of cladding material is lower than the refractive index of the material which provides the core for the mode guiding. In yet another embodiment, layer 103 can provide cladding functionality to layer 102 and mode 153, owning to its refractive index being lower by design as will be described with the help of FIG. 2 (*a*), FIG. 2 (*b*), and FIG. 2 (*c*) and integrated photonic device 230.

Layer 109 is a contact metal deposited on top of layer 101 as will be described in more detail with the help of FIG. 3 (*a*), and FIG. 3 (*b*). One or more lithography alignment marks (not shown in this cross sectional view, but see, for example, 220, 250 and/or 280 in FIG. 2 (*a*), FIG. 2 (*b*), and FIG. 2 (*c*) described below) are present to facilitate precise alignment between the layers formed during various processing steps.

In some embodiments, layer 108 is not present and both layers 101/106 are bonded and layer 103 is deposited on top of a patterned layer 102. In such embodiments, there is no planarization step as will be described with the help of FIG. 4.

FIG. 2 (*a*), FIG. 2 (*b*), and FIG. 2 (*c*) offer three top-down views of some embodiments of integrated photonic devices 200, 230 and 260 utilizing butt-coupling and mode conversion for efficient coupling between dissimilar materials.

Integrated photonic device 200 transfers the mode supported by active device 201, guiding it through layer 203 that serves to convert the mode for efficient coupling to layer 202. Optional coating layers (not shown) such as e.g. high-reflectivity and/or anti-reflective coating layers can be used at any of the interfaces between layers. Dashed lines A, B, C and D correspond to cross-sectional end-on views of a device according to some embodiments of the present invention described in more detail with the help of FIG. 3 (*a*), and FIG. 3 (*b*) and more specifically end-on-views 300A, 300B, 300C and 300D.

To facilitate coupling between modes supported by layers 201 and 202, the dimensions of layer 202 are tapered down towards layer 201, as indicated by the relatively small width of the tip 211 relative to the width of layer 202 shown at the extreme left of the figure.

It has been calculated that the requirements on taper dimensions are significantly relaxed due to the presence of layer 203. In contrast, in the absence of layer 203, layer 201 would have to be tapered such that its mode may directly couple into layer 202, the dimensions of taper tip of layer 201 (not shown) would have to be much less for a similar coupling efficiency. Furthermore, electrical pumping of such narrow tapers is challenging, and if, insufficiently pumped, could result with increased coupling losses.

In another embodiment, a taper is created in layer 203 instead of in layer 202 (not shown). In yet another embodiment, tapers may be created in both layers 202 and 203 for highly efficient coupling (not shown). In some embodiments, said tapers in layers 202 and 203 can be multistage tapers meaning they utilize more than one etch depth to facilitate more efficient coupling. In the case of taper in the layer 203, the width of layer 203 is generally reduced towards the left side of the figure to facilitate more efficient optical mode transfer.

Layer 209 is a contact metal deposited on top of layer 201 as will be described in more detail with the help of FIG. 3 (a), and FIG. 3 (b). One or more lithography alignment marks 220 (only one shown for simplicity) are used for precise alignment between various processing steps.

Integrated photonic device 230 transfers the mode supported by active device 231, guiding it through layer 233 that serves to convert the mode for efficient coupling to layer 232. Optional coating layers (not shown) such as e.g. high-reflectivity and/or anti-reflective coating layers can be used at any of the interfaces between layers. In contrast to integrated photonic device 200, in this embodiment shown in integrated photonic device 230 layer 233 also serves as a cladding material for waveguide in which layer 232 provide the core at the left side of the image.

To facilitate coupling between modes supported by layers 231 and 232, the dimensions of layer 232 are tapered down towards layer 231, as indicated by the relatively small width of the tip 241 relative to the width of layer 232 shown at the extreme left of the figure.

It has been calculated that the requirements on taper dimensions are significantly relaxed due to the presence of layer 233. In contrast, in the absence of layer 233, layer 231 would have to be tapered such that its mode may directly couple into layer 232, the dimensions of taper tip of layer 231 (not shown) would have to be much less for a similar coupling efficiency. Furthermore, electrical pumping of such narrow tapers is challenging, and if, insufficiently pumped, could result with increased coupling losses.

Layer 239 is a contact metal deposited on top of layer 231 as will be described in more detail with the help of FIG. 3 (a), and FIG. 3 (b). One or more lithography alignment marks 250 (only one shown for simplicity) are used for precise alignment between various processing steps.

Integrated photonic device 260 shows embodiments of the present invention, where boundaries between dissimilar materials are angled to control both the transmission and back reflection. The optical mode supported by active device 261 is guided through layer 263 that serves to convert the mode for efficient coupling to layer 262. Optional coating layers (not shown) such as e.g. high-reflectivity and/or anti-reflective coating layers can be used at any of the interfaces between layers. Both types of structures, as described with the help of integrated photonic device 200 and integrated photonic device 230, can utilize angled boundaries as will be described with the help of integrated photonic device 260, although the integrated photonic device 260 illustrates angled transition for the types of devices as described with the help of integrated photonic device 200.

To facilitate coupling between modes supported by layers 261 and 262, the dimensions of layer 262 are tapered down towards layer 261, as indicated by the relatively small width of the tip 271 relative to the width of layer 262 shown at the extreme left of the figure. It has been calculated that the requirements on taper dimensions are significantly relaxed up to several hundred nanometers due to the presence of layer 263. In another embodiment, a taper is created in layer 263 instead of in layer 262 (not shown). In yet another embodiment, tapers may be created in both layers 262 and 263 for highly efficient coupling. In some embodiments, said tapers in layers 262 and 263 can be multistage tapers meaning they utilize more than one etch depth to facilitate more efficient coupling.

Additionally, in this embodiment, one or more of the interfaces between layers 261 and/or 263 are angled to reduce corresponding back reflection(s). There could be multiple interfaces if coating layers (not shown) are utilized.

The angle 285 defines the angle between the tangent of the direction of propagation of the wave inside structure 261 and the facet (interface toward 263). Angle 285 is primarily utilized to control the backreflection of the modes supported by layer 261 when they reach the interface toward 263. In one embodiment the angle is substantially equal to 0°. In yet another embodiment it is between 1° and 45°. In yet another embodiment it is substantially equal to 8°. In yet another embodiment it is greater than 8° and smaller than 20°. In yet another embodiment it is larger than 20°.

The angle 290 defines the angle between the direction of the propagation of the wave inside the structure 261 and the direction of propagation of the wave inside structure 263. Said angle is an optimization parameter for coupling efficiency between the modes supported by layer 261 and 263 and is related to the choice of the angle 285 and the refractive indices of used materials in layers 261 and 263 and their respective claddings. In one embodiment it is substantially equal to 0°. In yet another embodiment it is between 1° and 45°. In yet another embodiment it is substantially equal to 8°. In yet another embodiment it is greater than 8° and smaller than 25°. In yet another embodiment it is larger than 25°.

Precise vertical alignment (up/down in view 260) between the axis defined by the center of the optical mode as it propagates inside the structure 261 and the center of the waveguide 263 at the interface between 261/263 is an optimization parameter where such offset can be positive (up in view 260), negative (down in view 260) and/or substantially equal to 0 (no offset). Such optimization is straightforward to perform with numerical software to maximize the performance of the transition together with optimizing the angle 290.

Layer 269 is a contact metal deposited on top of layer 261 as will be described in more detail with the help of FIG. 3 (a), and FIG. 3 (b). One or more lithography alignment marks 280 (only one shown for simplicity) are used for precise alignment between various processing steps.

Figure 3A:
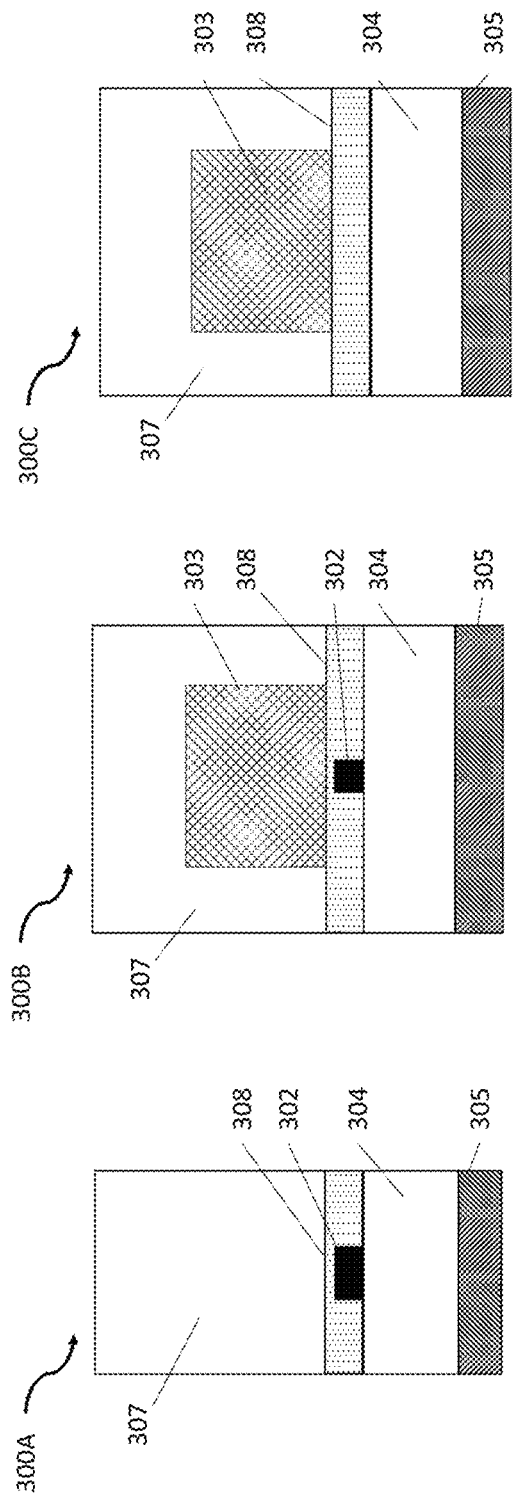
FIG. 3 (a), and FIG. 3 (b) show a cross-sectional end-on views of a device according to some embodiments of the present invention.
Figure 3B:
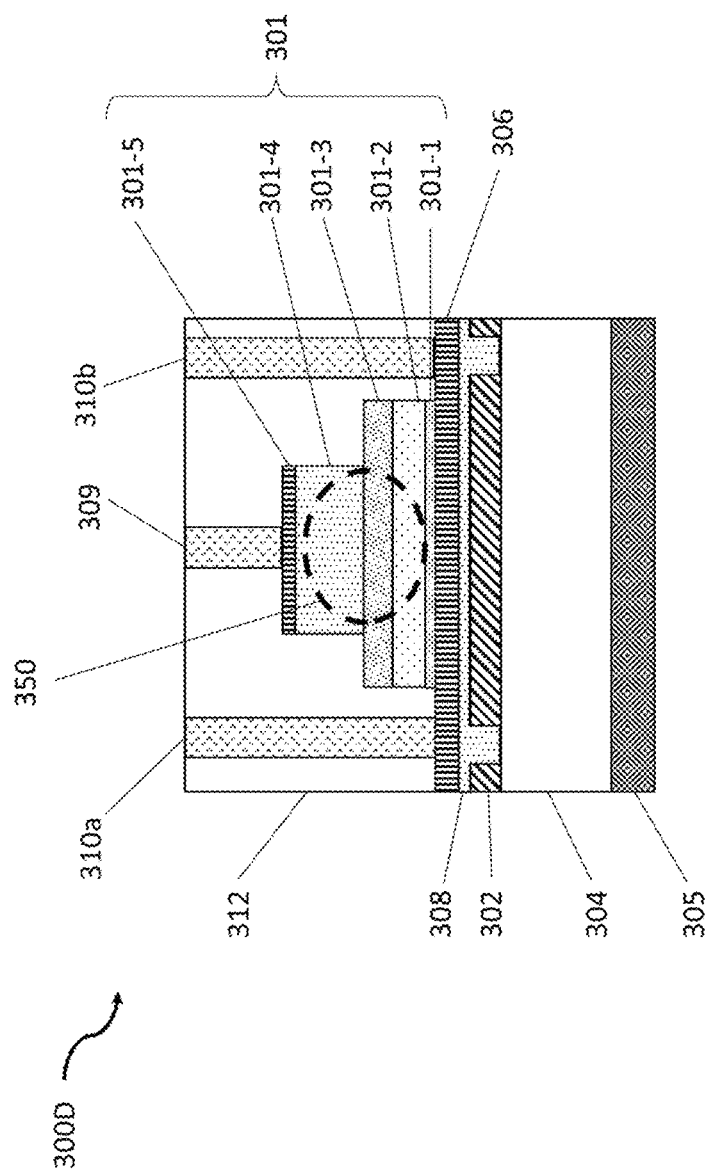

FIG. 3 (a), and FIG. 3 (b) show four cross-sectional views 300A, 300B, 300C, and 300D corresponding to four characteristic locations marked A, B, C, and D in FIG. 1 and FIG. 2 (a), and FIG. 2 (c) (devices 200 and 260). Similar cross-sectional views could be drawn for FIG. 2 (b) device 230 where the key difference would be in characteristic location marked with A (not shown). Functional layers 301 to 308 (unless explicitly defined differently) correspond to functional layers 101 to 108 as described in relation to FIG. 1.

Cross-section 300A shows one embodiment at the far left of the device as shown in FIG. 1, after optical coupling to layer 302 (assuming optical signal flow occurs from right to left in FIG. 1) is complete. Cross-section 300B shows one embodiment in which transition of mode from one dominantly residing in layer 303 to one dominantly residing in layer 302 is facilitated. This transition is facilitated by tapers realized in at least one of the layers 302 and 303. Cross-section 300C shows one embodiment in which mode dominantly resides in layer 303 after it was butt-coupled from the structure providing guiding in cross-section 300D. Typical heights and widths of waveguides formed in layers 301, 302, and 303 can range from submicron (as little as 20 nm) to several microns, although they are largely dependent on specific material systems, wavelength of operation and implementations. Optimal dimensions (width, height, sidewall angle, etc.) to facilitate efficient coupling can be readily calculated using e.g. commercial simulation tools or similar. In some embodiments thickness of layer 302 (vertical dimension in FIG. 3 (*a*), and FIG. 3 (*b*)) is between 20 nm and 400 nm, in yet other embodiments it is between 400 nm and 2000 nm.

Cross-section 300D shown an exemplary cut through a region that comprises active device. Layer 301 comprises multiple sub-layers providing necessary functionality to realize active devices. In one embodiment (as shown in 300D), layer 306 is providing at least one of electrical contact, current spreading, optical mode confinement and/or improvement of surface quality compared to layer 301 surface quality, while layer 308 is providing a planarized top surface for bonding. In another embodiment (not shown), layer 306 is on top of layer 302 as planarization layer 308 was completely removed on top of layer 302. In another embodiment (not shown, but described with the help of FIG. 4), layer 306 is on top of layer 302 but without the planarization layer 308 resulting with air gaps in regions where layer 302 is patterned (not shown). In yet another embodiment (not shown), layer 306 is on top of layer 304 (if layer 302 is completely removed) and/or is on top of layer 305 (if layer 302 and 304 are completely removed). In one embodiment, layer 306 comprises TCO.

Layer 301 (and in some embodiments layer 306) serves to define optical and electrical confinement to facilitate high performance active devices. Optical confinement in vertical direction (in view 300D) is provided by material composition corresponding to different refractive indices, and optical confinement in horizontal direction is provided by at least one etch to provide for cladding (312) with reduced refractive index. Cladding 312 can comprise multiple materials, some of which might provide passivation functionality to the etched surfaces leading to improved laser performance. Electrical confinement is provided by material composition, and etched or implanted current channels.

In one embodiment, the active layer 301 comprises five distinct functional sub-layers: 301-1, 301-2, 301-3, 301-4 and 301-5. In some other embodiments, not all sub-layers have to be present, but at minimum there are 301-1, 301-3 and 301-5.

Sub-layer 301-1 is a p-contact layer. Such layers are generally challenging to grow in GaN material systems, so in certain embodiments layer 306 is utilized to provide electrical contact to metal 310a and 310b and current spreading functionality while keeping the layer 301-1 relatively thin. Sub-layer 301-1 can comprise multiple sub-layers, aside from the mentioned p-contact layer, such as etch stop layers, bandgap smoothing layers and/or others generally used to improve the performance of the device or improve the uniformity of semiconductor processing.

Sub-layer 301-2 is the p-cladding layer that can comprise multiple sublayers in itself with the main purpose of sub-layer 301-2 to control the optical mode 350 and provide optimized confinement in the active region. Layer 301-2 can also comprise etch stop layers, bandgap smoothing layers and/or others. In some embodiments, functionality of the confinement can, at least in part, be realized utilizing layer 306.

Sub-layer 301-3 is the active region that in one embodiment comprises at least one of quantum wells, quantum barriers and separate confinement heterostructure (SCH) layers, as is known to someone skilled in the art of designing GaN based active optical devices. In some embodiments, quantum dots are used instead of quantum wells. In other embodiments quantum dots embedded inside quantum wells are used. In yet another embodiment bulk p (i) n-junctions are defined in active region to provide e.g. photodetector functionality or bulk phase/intensity modulator functionality. One or more SCH layers, if present, can be graded or non-graded. Additional etch-stop layers can be incorporated to facilitate better semiconductor processing control.

Sub-layer 301-4 is the n-cladding layer that can comprise multiple sublayers in itself. Thickness and the refractive index of 301-4 are optimization parameters to control the confinement in the active region and to reduce the absorption loss in the contact layer above. 301-4 can also comprise one or more etch stop and bandgap-smoothing layers.

Sub-layer 301-5 is the n-contact layer providing efficient electrical contact to metal 309.

At least two metal contacts, three of which (309, 310a and 310b) are shown in the case of view 300D, are used to provide carrier injection, application of electrical field and/or both to the active region.

In the embodiment shown in cross-section 300D, two etches are utilized: one, typically stopping above the active region defines the optical mode 350 as well as provides the current confinement functionality, and the second one opening access to layer 306 to provide at least one set of electrical contacts 310a/310b. In other embodiments, a single etch through full layer 301 can provide all mentioned functionalities. In yet other embodiments more than two etches can be utilized to better control process quality. It is to be understood that particular etch (with intent to stop at precise location in the layer 301) can comprise both dry and wet etches to improve quality, as well as multiple lithography steps as is known in the art.

Figure 4:
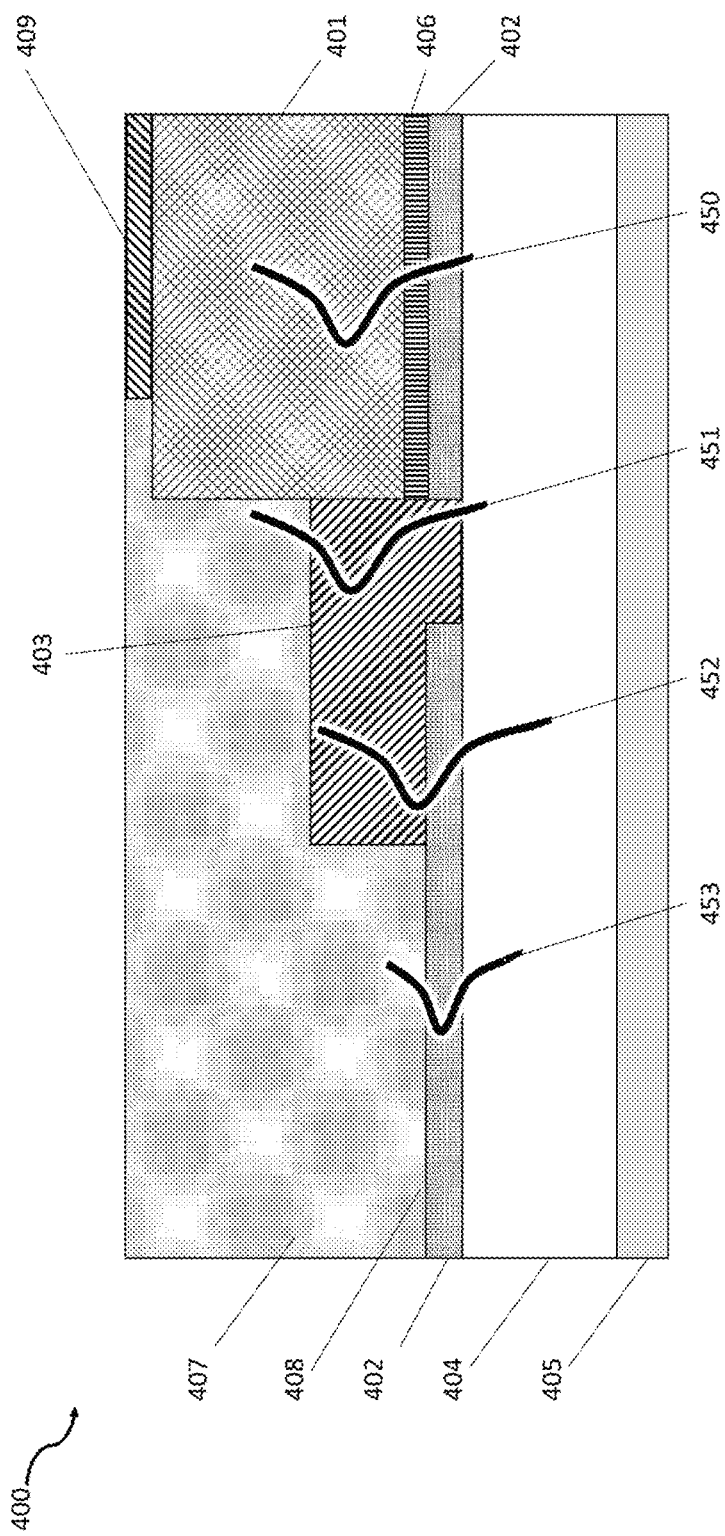
FIG. 4 shows a cross-sectional view of a device according to some embodiments of the present invention.

FIG. 4 is a schematic cross-section view of one embodiment of an integrated photonic device 400 utilizing butt-coupling and mode conversion for efficient coupling between dissimilar materials in which there is no planarization layer 108 as described in relation to FIG. 1. Functional layers 401 to 409 (unless explicitly defined differently) correspond to functional layers 101 to 109 as described in relation to FIG. 1, and modes 450 to 453 correspond to similar modes 150 to 153 as described in relation to FIG. 1. Due to the absence of planarization layer (108 in FIG. 1), the bottom surface of layer 403 is not planar leading to generally reduced coupling efficiency from 450 to 453 compared to the planarization case described in FIG. 1. The benefit of this approach is in simplified processing which does not require deposition of material to provide planarization with or without chemical-mechanical polishing (CMP). The main challenge with CMP is the ability to provide good uniformity across wafer, in absence of which there is larger variation in device performance. Some applications can benefit from simplified processing despite nominally reduced coupling efficiency as illustrated with the help of FIG. 4.

The present invention is directed towards PICs employing GaN actives integrated with high-performance waveguides that includes lasers, amplifiers, modulators and photodetectors with improved performance. In particular, embodiments described below are concerned with the detailed design of the heterogeneous integration, optical coupling structure and mode control necessary for creating of high-performance lasers, amplifiers, modulators and photodetectors.

Embodiments of the present invention offer many benefits. The integration platform enables scalable manufacturing of PICs made with GaN materials to large wafers (up to 12 inch currently) using die-to-wafer or wafer-to-wafer bonding, and also providing high-performance waveguides and passive components.

Other approaches have relied on die attachment of prefabricated optical active devices to passive waveguides. This requires very stringent alignment accuracy which is typically beyond what a typical die-bonder can provide. This aspect limits the throughput of this process as well as the performance of optical coupling.

Efficient optical transfer between dissimilar materials is facilitated by using a butt-coupling approach in combination with a mode-converter (the intermediate waveguide) that removes the need for narrow taper tips in active material that are challenging to resolve and fabricate with current state-of-the-art tools while also providing challenging optical pumping. The transition between intermediate waveguide and passive waveguide utilizes tapers in both to facilitate efficient coupling, but generally provides high performance even with tapers whose width exceeds 100 nm or more.

It is to be understood that optical coupling between modes in active and passive layers is reciprocal, so that, taking FIG. 1 as exemplary, the structure can be configured to facilitate light transmission from region 101 to region 102, but also to facilitate transmission in the reverse direction, from region 102 to region 101. In is to be understood that multiple such transitions with no limitation in their number or orientation can be realized on a suitably configured PIC.

Embodiments of the optical devices described herein may be incorporated into various other devices and systems including, but not limited to, various computing and/or consumer electronic devices/appliances, communication systems, sensors and sensing systems.

It is to be understood that the disclosure teaches just few examples of the illustrative embodiment and that many variations of the invention can easily be devised by those skilled in the art after reading this disclosure and that the scope of the present invention is to be determined by the following claims.

The invention claimed is:

1. A device comprising:
first, second, third and fourth elements fabricated on a common substrate;
wherein the first element comprises an active waveguide structure supporting a first optical mode, the second element comprises a passive waveguide structure supporting a second optical mode, the third element, at least partly butt-coupled to the first element, comprises an intermediate waveguide structure supporting intermediate optical modes, and a fourth element comprising TCO material that is attached to the first element;
wherein, if the first optical mode differs from the second optical mode by more than a predetermined amount, a tapered waveguide structure in at least one of the second and third elements facilitates efficient adiabatic transformation between the second optical mode and one of the intermediate optical modes;
wherein no adiabatic transformation occurs between any of the intermediate optical modes and the first optical mode; and
wherein mutual alignments of the first, the second and the third elements are defined using lithographic alignment marks that facilitate precise alignment between layers formed during processing steps of fabricating the first, the second and the third elements.

2. A device of claim 1,
wherein a lower surface of the third element is planar.

3. The device of claim 1,
wherein an interface between the first and third elements is angled at an angle optimized to minimize reflections.

4. The device of claim 3, further comprising:
an anti-reflective coating layer deposited on the interface between the first and the third elements.

5. A device of claim 1,
wherein the first element comprises GaN-based semiconductor layers.

6. A device of claim 1,
wherein a refractive index of second element is between 1.6 and 2.2.

7. A device of claim 1,
wherein the second element comprises SiN-based material.

8. A device of claim 6,
wherein a refractive index of third element is between 1.55 and 2.15 and is lower than the refractive index of second element.

9. A device of claim 1,
wherein the first element comprising the active waveguide structure has at least three sub-layers;
wherein at least one of the sub-layers in the active waveguide structure comprises a n-contact layer; and,
wherein at least one of the sub-layers in the active waveguide structure comprises an active region, and at least one of the sub-layers in the active waveguide structure comprises a p-contact layer.

10. A device of claim 9,
wherein at least one of the sub-layers comprises an etch stop layer.

11. A device of claim 9,
wherein the first element is defined using at least one etch to provide an optical mode confinement and an open contact region in fourth element for metal deposition.

12. A device comprising:
first, second, third and fourth elements fabricated on a common substrate;
wherein the first element comprises an active waveguide structure supporting a first optical mode, the second element comprises a passive waveguide structure supporting a second optical mode, the third element, at least partly butt-coupled to the first element, comprises an intermediate waveguide structure supporting intermediate optical modes, and a fourth element comprising TCO material that is attached to the first element;
wherein third element provides a cladding for the second element;
wherein, if the first optical mode differs from the second optical mode by more than a predetermined amount, a tapered waveguide structure in second element facilitates efficient adiabatic transformation between the second optical mode and one of the intermediate optical modes;

wherein no adiabatic transformation occurs between any of the intermediate optical modes and the first optical mode; and wherein mutual alignments of the first, the second and the third elements are defined using lithographic alignment marks that facilitate precise alignment between layers formed during processing steps of fabricating the first, the second and the third elements.

13. A device of claim 12,
wherein a lower surface of the third element is planar.

14. The device of claim 12,
wherein an interface between the first and the third elements is angled at an angle optimized to minimize reflections.

15. The device of claim 14, further comprising:
an anti-reflective coating layer deposited on the interface between the first and the third elements.

16. A device of claim 12,
wherein the first element comprises GaN-based semiconductor layers.

17. A device of claim 12,
wherein a refractive index of second element is between 1.6 and 2.2.

18. A device of claim 12,
wherein the second element comprises SiN-based material.

19. A device of claim 17,
wherein a refractive index of third element is between 1.55 and 2.15 and is lower than the refractive index of second element.

20. A device of claim 1, wherein the second element comprises AlN-based material.

* * * * *